United States Patent
Kondo

(10) Patent No.: US 10,720,478 B2
(45) Date of Patent: Jul. 21, 2020

(54) ORGANIC EL DISPLAY PANEL, ORGANIC EL DISPLAY DEVICE, AND ORGANIC EL DISPLAY PANEL MANUFACTURING METHOD

(71) Applicant: JOLED INC., Tokyo (JP)

(72) Inventor: Masahiko Kondo, Tokyo (JP)

(73) Assignee: JOLED INC., Tokyo (JP)

( * ) Notice: Subject to any disclaimer, the term of this patent is extended or adjusted under 35 U.S.C. 154(b) by 32 days.

(21) Appl. No.: 16/219,949

(22) Filed: Dec. 14, 2018

(65) Prior Publication Data

US 2019/0189713 A1    Jun. 20, 2019

(30) Foreign Application Priority Data

Dec. 15, 2017 (JP) .................. 2017-240719
Nov. 8, 2018 (JP) .................. 2018-210795

(51) Int. Cl.
| | | |
|---|---|---|
| H01L 27/32 | (2006.01) |
| H01L 51/50 | (2006.01) |
| H01L 51/52 | (2006.01) |
| H01L 51/56 | (2006.01) |
| H01L 51/00 | (2006.01) |

(52) U.S. Cl.
CPC ...... *H01L 27/3246* (2013.01); *H01L 27/3258* (2013.01); *H01L 51/0005* (2013.01); *H01L 51/5012* (2013.01); *H01L 51/5056* (2013.01); *H01L 51/5072* (2013.01); *H01L 51/5092* (2013.01); *H01L 51/5206* (2013.01); *H01L 51/5218* (2013.01); *H01L 51/5221* (2013.01); *H01L 51/5265* (2013.01); *H01L 51/56* (2013.01); *H01L 27/3211* (2013.01); *H01L 2227/323* (2013.01); *H01L 2251/5315* (2013.01); *H01L 2251/558* (2013.01)

(58) Field of Classification Search
CPC ............. H01L 27/3246; H01L 27/3258; H01L 27/3211; H01L 2227/323; H01L 2251/5315; H01L 2251/558; H01L 51/0005; H01L 51/5012; H01L 51/5056; H01L 51/5072; H01L 51/5092; H01L 51/5206; H01L 51/5218; H01L 51/5221; H01L 51/5265; H01L 51/56
USPC ........................................................ 257/40
See application file for complete search history.

(56) References Cited

U.S. PATENT DOCUMENTS

| | | | |
|---|---|---|---|
| 7,679,283 B2 * | 3/2010 | Nimura | ............... H01L 27/3267 313/503 |
| 9,627,458 B2 | 4/2017 | Kim | |
| 2016/0284776 A1 | 9/2016 | Kim | |

FOREIGN PATENT DOCUMENTS

JP    2016-181498 A    10/2016

* cited by examiner

*Primary Examiner* — Tu-Tu V Ho
(74) *Attorney, Agent, or Firm* — Hauptman Ham, LLP

(57) ABSTRACT

An organic EL display panel having a light emitting layer or a functional layer formed by an application method and having a beneficial film thickness control, and a manufacturing method thereof. The organic EL display panel includes a substrate, pixel electrodes above the substrate, banks in gaps between the pixel electrodes, and a first and a second light emitting layer. A film thickness of the first light emitting layer is thicker than that of the second light emitting layer. The bank is provided with a first and a second bank portion, a height of the first bank portion being higher than a height of the second bank portion. A first pinning position where a sidewall of the first bank portion contacts with the first light emitting layer is higher than a second pinning position where the sidewall of the second bank portion contacts with the second light emitting layer.

13 Claims, 14 Drawing Sheets

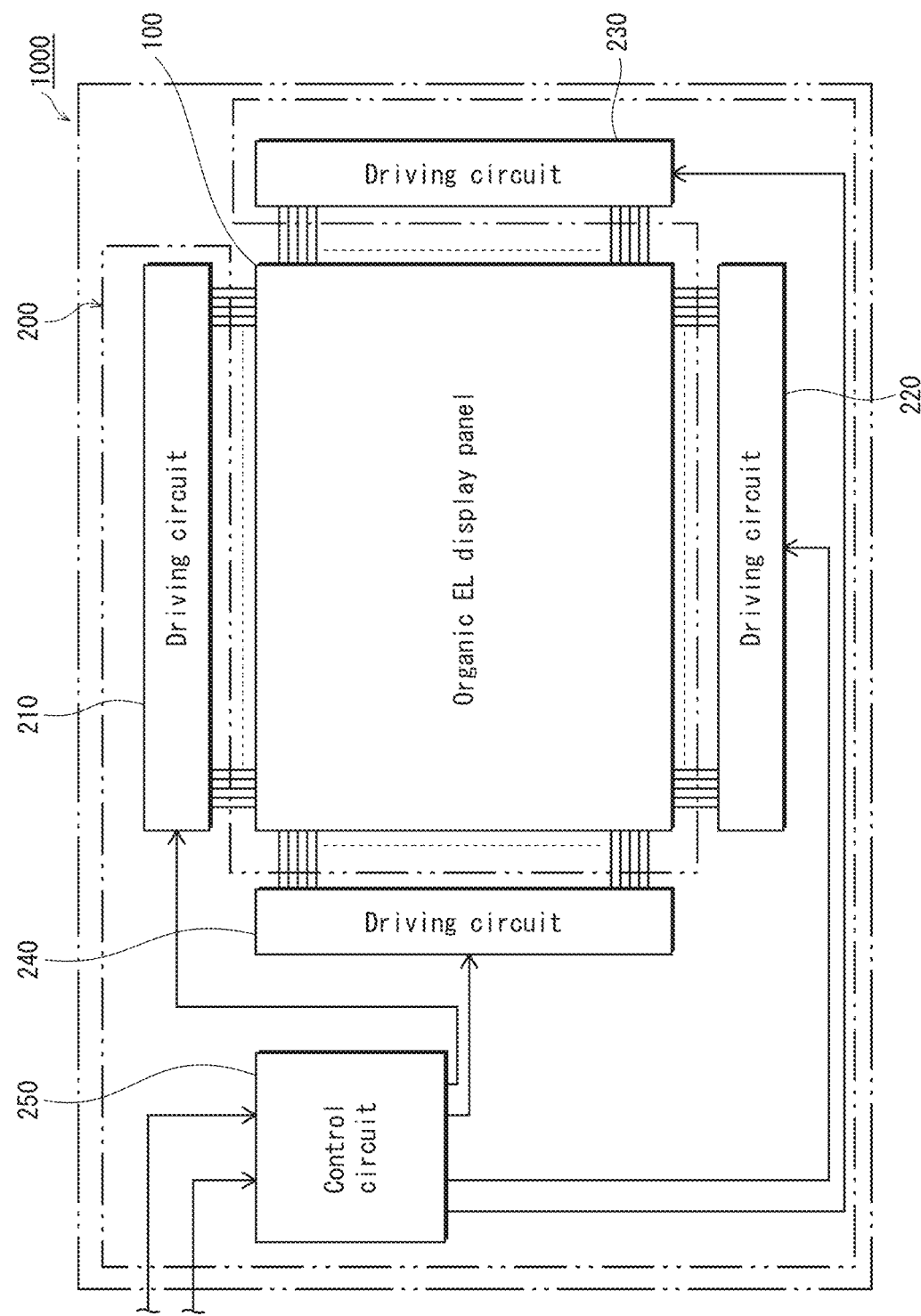

ORGANIC EL DISPLAY PANEL, ORGANIC EL DISPLAY DEVICE, AND ORGANIC EL DISPLAY PANEL MANUFACTURING METHOD

This application claims priority to Japanese Patent Applications No. 2017-240719, filed Dec. 15, 2017, and No. 2018-210795, filed Nov. 8, 2018, the contents of which are hereby incorporated by reference in their entirety.

BACKGROUND

Technical Field

The present disclosure relates to organic electroluminescence (EL) display panels that use organic EL elements that make use of electroluminescence of organic material, and organic EL display devices that use organic EL elements.

Description of the Related Art

In recent years, display devices using organic EL elements have become popular.

The organic EL elements have a structure with at least a light emitting layer sandwiched between an anode and a cathode. At present, as a method for efficient forming of the light emitting layers and functional layers, a wet process such as an inkjet method disposing ink containing functional materials is being used. The wet process, in comparison to a vacuum vapor deposition method, allows downsizing of manufacturing devices and eliminates the need to use shadow masks for depositing the functional materials. Therefore, the wet process is suitable for efficient manufacturing of the panels, as work processes such as positioning of the shadow masks are unnecessary, and manufacturing of large substrates for large panels and for efficient mass production of mixed panels sizes are facilitated. Moreover, in contrast to the deposition method, the inkjet method increases usage efficiency of functional materials such as that of costly light emitting materials, and thus reduces costs for manufacturing the panels.

In the inkjet method, partition walls called banks are formed for each subpixel in order to apply and to print an ink in which the light emitting materials or the functional materials are dissolved. When an ink containing the functional materials flows over the banks and mixes with an adjacent ink, in particular, when an ink containing the light emitting materials flows over the banks and mixes with different colors of ink, defects are caused in the panels. To suppress the ink from flowing over, liquid repellency is imparted to surfaces of top portions of the banks.

However, when liquid repellency is imparted to the top portions of the sidewalk of the banks, edges of the functional layers are left pinned to the interfaces between the lyophilic portions and the liquid repellent portions at the sidewalls of the banks. An example of a method of adjusting the pinning positions is to impart liquid repellency to portions of the sidewalk of the banks as disclosed in JP 2016-181498.

SUMMARY

The present disclosure includes an organic EL display panel with a beneficial film thickness control when the organic EL display panel has at least a light emitting layer or a functional layer formed by an application method, and a method of manufacturing such an organic EL display panel.

An organic EL display panel according to at least one embodiment of the present disclosure includes a substrate, pixel electrodes arranged in a matrix above the substrate, banks arranged above the substrate, extending in a column direction between the pixel electrodes adjacent to each other in a row direction, a first light emitting layer disposed in a first gap selected from gaps between the banks adjacent to each other in the row direction above the pixel electrodes, a second light emitting layer disposed in a second gap adjacent to the first gap in the row direction above the pixel electrodes, and a counter electrode disposed above the first light emitting layer and above the second light emitting layer, wherein a film thickness of the first light emitting layer is thicker than a film thickness of the second light emitting layer, a bank between the first gap and the second gap has a first bank portion facing the first gap and a second bank portion facing the second gap, a height of the first bank portion being higher than a height of the second bank portion, and a first pinning position where a sidewall of the first bank portion contacts with the first light emitting layer is higher than a second pinning position where the sidewall of the second bank portion contacts with the second light emitting layer.

According to the organic EL display panel of at least one embodiment, both the first and the second light emitting layers have a structure whereby the pinning positions correspond to the film thicknesses, and thus the organic EL display panel with a beneficial film thickness control is provided.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 9A is a partial cross-sectional view of a state illustrating TFT layer formed on base material. FIG. 9B is a partial cross-sectional view of a state illustrating interlayer insulating layer formed on TFT layer. FIG. 9C is a partial cross-sectional view of a state illustrating pixel electrode material layer formed on interlayer insulating layer. FIG. 9D is a partial cross-sectional view of a state illustrating pixel electrodes formed by patterning pixel electrode material layer. FIG. 9E is a partial cross-sectional view of a state illustrating banks formed on pixel electrodes and interlayer insulating layer.

FIG. 10A is a partial cross-sectional view of a state illustrating hole injection layers formed in openings between banks. FIG. 10B is a partial cross-sectional view of a state illustrating hole transport layers formed in openings between banks. FIG. 10C is a partial cross-sectional view of a state illustrating light emitting layers formed in openings between banks.

FIG. 11A is a partial cross-sectional view of a state illustrating electron transport layer formed on banks and light emitting layers. FIG. 11B is a partial cross-sectional view of a state illustrating electron injection layer formed on electron transport layer. FIG. 11C is a partial cross-sectional view of a state illustrating counter electrode formed on electrode injection layer. FIG. 11D is a partial cross-sectional view of a state illustrating sealing layer formed on counter electrode.

FIG. 14 is a schematic block diagram of a configuration of organic EL display device according to at least one embodiment.

DETAILED DESCRIPTION

Background of the Embodiments

Figure 1:
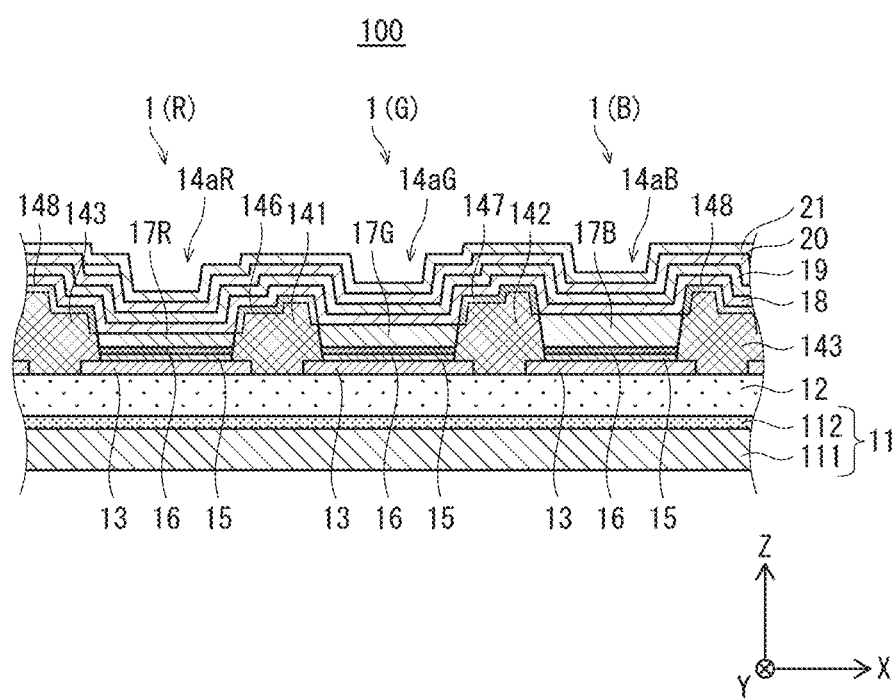
FIG. 1 is a schematic cross-sectional view of a configuration of organic EL display panel 100 according to at least one embodiment.

When light emitting layers or functional layers are formed by using an application method, ink in which a material is dissolved is applied to gaps between banks. Since liquid repellency is imparted to the top portions of the banks and the upper portions of the sidewalk of the banks to prevent the ink from flowing over the banks, the ink does not adhere to the liquid repellent portions of the sidewalk of the banks. On the other hand, the position of the ink adhering to lyophilic portions of the sidewalk of the banks remains without lowering even after drying, so that contact points between the light emitting layers and the sidewalk of the banks, and between the functional layers and the sidewalls of the banks are fixed (pinned) at the interfaces between the liquid repellent portions and the lyophilic portions.

When the banks are formed, typically, the lyophilic portions and the liquid repellent portions are formed at the same time. In particular, a fluorine-based or a silicone-based liquid repellent surfactant is added to a lyophilic photoresist such as an acrylic, a methacrylic, a polyimide, or a phenolic photoresist, which is then applied, irradiated with light using a photomask, developed, and baked. This forming procedure allows densities of the liquid repellent surfactant to become higher in upper parts and lower in lower parts, and thus provides the upper portions of the banks including the top portions with liquid repellency, and the lower portions of the banks with lyophilic property. The interfaces between the liquid repellent portions and the lyophilic portions, which are pinning positions, are determined by heights of the banks and added amount of the liquid repellent surfactant.

On one hand, film thicknesses of the light emitting layers and the functional layers are determined by various factors including light emitting function of the light emitting layers, carrier injecting function, transporting function, and blocking function of the functional layers, light transmittance, and film thickness enabling an optical resonator structure. Thus, optimal film thicknesses often vary among the organic EL elements having light emitting layers that emit different colors. On the other hand, as described above, unevenness in heights of the pinning positions and the heights of the top surfaces of the light emitting layers or the functional layers cause unevenness in film thicknesses of the light emitting layers and the functional layers. Therefore, the pinning positions are changed for each of the emitted colors of light. For example, in the schematic cross-sectional view in FIG. 3A, when banks 814 are formed at same heights using a same material, liquid repellent portions 842 are formed at a same range of heights. Then, the pinning positions become the same regardless of the thickness of the light emitting layers, causing the film thickness of the light emitting layers to become uneven. In particular, an upper surface of light emitting layer 917a becomes a concave shape as the pinning position is high with respect to the film thickness of light emitting layer 917a, and an upper surface of light emitting layer 917b becomes a convex shape as the pinning position is low with respect to the film thickness of light emitting layer 917b.

In order to solve this problem, for example, as described in Japanese Patent Publication No. 2016-181498, the heights of the liquid repellent portions are controlled. However, controlling only the pinning positions without changing the heights of the banks does not suppress the ink from flowing over the banks if the pinning positions are too high with respect to the banks, and thus, as in the schematic cross-sectional view in FIG. 3B, the heights of banks 824a, 824b, and 824c are set according to light emitting layer 927b which has the greatest film thickness. Then, however, banks 824a and 824b, which are two banks that define light emitting layer 927a, become too high with respect to the film thickness of light emitting layer 927a Moreover, integrally forming the lyophilic portions and the liquid repellent portions of the banks becomes difficult since liquid repellent portion 843a of bank 824a, liquid repellent portion 843b of bank 824b, and liquid repellent portion 843c of bank 824c are asymmetrical with respect to two adjacent light emitting layers.

The inventors have studied an organic EL display panel whereby lyophilic portions and liquid repellent portions of the banks are integrally formed while pinning positions and heights of the banks are appropriately designed, and have reached the present disclosure.

Embodiments of the Disclosure

Herein an organic EL display panel and a method of manufacturing an organic display panel are described, in which "A being above B" means "A is layered relative to B, while A may be spaced from or in direct contact with B".

An organic EL display panel according to at least one embodiment of the present disclosure includes a substrate, pixel electrodes arranged in a matrix above the substrate, banks arranged above the substrate, extending in a column direction between the pixel electrodes adjacent to each other in a row direction, a first light emitting layer disposed in a first gap selected from gaps between the banks adjacent to each other in the row direction above the pixel electrodes, a second light emitting layer disposed in a second gap adjacent to the first gap in the row direction above the pixel electrodes, and a counter electrode disposed above the first light emitting layer and above the second light emitting layer, wherein a film thickness of the first light emitting layer is thicker than a film thickness of the second light emitting layer, a bank between the first gap and the second gap has a first bank portion facing the first gap and a second bank portion facing the second gap, a height of the first bank portion being higher than a height of the second bank portion, and a first pinning position where a sidewall of the first bank portion contacts with the first light emitting layer is higher than a second pinning position where the sidewall of the second bank portion contacts with the second light emitting layer.

A method of manufacturing an organic EL display panel according to at least one embodiment of the present disclosure includes preparing a substrate, forming pixel electrodes above the substrate in a matrix, forming banks above the substrate extending in a column direction between the pixel electrodes adjacent to each other in a row direction, forming a first light emitting layer in a first gap selected from gaps between the banks adjacent to each other in the row direction by applying ink including a first light emitting material, forming a second light emitting layer in a second gap adjacent to the first gap in the row direction by applying ink including a second light emitting material, the second light emitting layer having a film thickness less than the film thickness of the first light emitting layer, and forming a counter electrode above the first light emitting layer and the second light emitting layer, wherein in the forming of the banks, a height of a first bank portion facing the first gap is made higher than a height of a second bank portion facing the second gap, and liquid repellent portions are extended from top portions of the banks to a sidewall of the first bank portion.

According to the organic EL display panel of at least one embodiment and the organic EL display panel manufacturing method of at least one embodiment, both the first and the second light emitting layers have a structure whereby the pinning positions correspond to the film thicknesses, and thus the organic EL display panel with a beneficial film thickness control is provided.

Moreover, the organic EL display panel of at least one embodiment and the organic EL display panel manufacturing method of at least one embodiment may have the following features.

A height of the first pinning position may depend on the height of the first bank portion, and a height of the second pinning position may depend on the height of the second bank portion.

Thus, the height of the bank portions and the pinning positions are linked with each other for each of the gaps and are optimized for the light emitting layers and the functional layers in each of the gaps, and therefore the film thicknesses of the light emitting layers and the functional layers are homogenized.

Moreover, the height of the first pinning position may be a value obtained by multiplying the height of the first bank portion by a first coefficient, and the height of the second pinning position may be a value obtained by multiplying the height of the second bank portion by a second coefficient.

Thus, by controlling the height of the bank portions sandwiching each of the gaps, the pinning positions can be controlled for each of the gaps.

Moreover, the first coefficient may be different from the second coefficient.

Thus, for each of the gaps, relationship between the height of the bank portions sandwiching the gaps and the height range of the pinning positions is optimized according to the light emitting layer and the functional layer disposed in the gap.

Moreover, the height of the first pinning position may be lower than the height of the first bank portion by a predefined value, and the height of the second pinning position may be lower than the height of the second bank portion by the predefined value.

Thus, differences between the pinning positions and the heights of the top portions of the banks are uniformized.

Moreover, the first bank portion may be formed by an electrically insulating resin material and include a surfactant having liquid repellency, and the second bank portion may be formed by the same or a different electrically insulating resin material and include the same or a different surfactant having liquid repellency.

Further, the surfactant may be a fluorine-based compound or a silicone-based compound.

Further, the forming of the banks may include using a resin material including a surfactant having liquid repellency as a material for the banks, and providing the liquid repellent portions which are portions of the banks containing a predefined ratio or more of the surfactant.

Further, a fluorine-based compound or a silicone-based compound may be used as the surfactant.

Thus, the bank portions are integrally formed and the forming process of the banks is simplified.

Moreover, the surfactant of the sidewall of the first bank portion may be present in higher ratio above the first pinning position than below the first pinning position in the sidewall of the first bank portion facing the first light emitting layer, and the surfactant of the sidewall of the second bank portion may be present in higher ratio above the second pinning position than below the second pinning position in the sidewall of the second bank portion facing the second light emitting layer.

Further, the forming of the banks may include using a resin material including a surfactant having liquid repellency as a material for the banks, and providing the liquid repellent portions which are portions of the banks containing a predefined ratio or more of the surfactant.

Thus, upper portion surfaces of the bank portions become the liquid repellent portions and the forming process of the banks is simplified.

Moreover, the height of the second pinning position may be higher than the height of the first bank portion, and in the forming of the banks, the second bank portion may be formed after forming the first bank portion.

Thus, an effect on other low bank portions is minimized when forming the bank portions.

Embodiments

1. Overall Configuration of Organic EL Display Panel

An organic EL display panel according to at least one embodiment is described with reference to the drawings.

FIG. 1 is a partial cross-sectional view of an organic EL display panel 100 according to at least one embodiment. The organic EL display panel 100 includes pixels, each provided with organic EL elements 1(R), 1(G), and 1(B) that emit three colors (red, green, and blue).

In the organic EL display panel 100, each of the organic EL elements 1 is of a so-called top emission type which emits light forward (upper direction in FIG. 1).

Since the organic EL elements 1(R), 1(G), and 1(B) have almost the same structure, they will be described as the organic EL elements 1 unless distinction is made between them.

In FIG. 1, the organic EL elements 1 include a substrate 11, an interlayer insulating layer 12, pixel electrodes 13, banks 141, 142, and 143, hole injection layers 15, hole transport layers 16, light emitting layers 17, an electron transport layer 18, an electron injection layer 19, a counter electrode 20, and a sealing layer 21. Note that the substrate 11, the interlayer insulating layer 12, the electron transport layer 18, the electron injection layer 19, the counter electrode 20, and the sealing layer 21 are not formed for each pixel, but are formed in common to the organic EL elements 1 included in the organic EL display panel 100.

Figure 2:
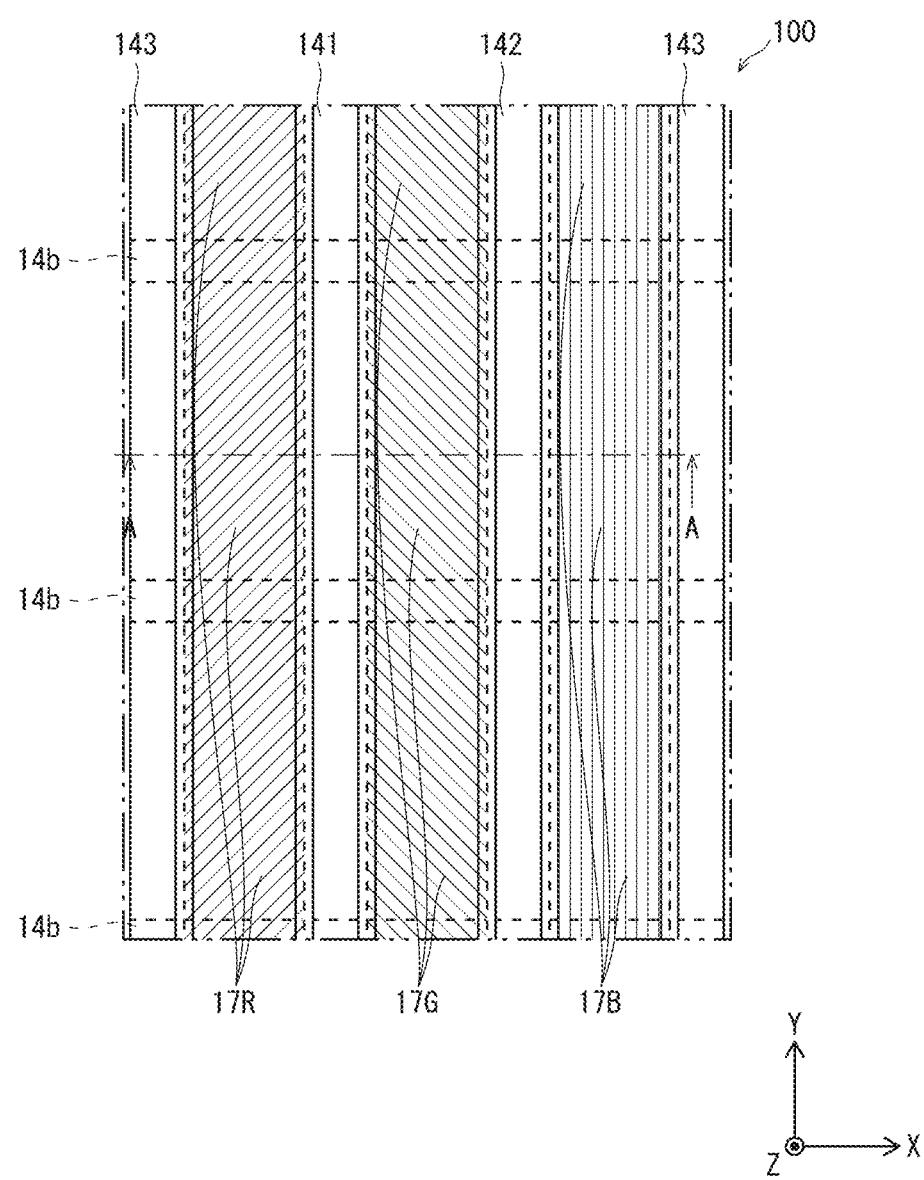
FIG. 2 is a schematic plan view of a configuration of organic EL display panel 100 according to at least one embodiment.

FIG. 2 is a schematic plan view of the organic EL display panel 100 according to at least one embodiment. In FIG. 2, the organic EL display panel 100 according to at least one embodiment adopts a so-called line bank structure. That is, the organic EL display panel 100 includes banks 141, banks 142, and banks 143 elongated in a Y direction and spaced from each other in an X direction, and sub-banks 14b elongated in the X direction and spaced from each other in the Y direction. Note that FIG. 1 corresponds to a cross-sectional view taken along a line A-A in FIG. 2.

Pairs of the banks 141 and 142, banks 142 and 143, and banks 141 and 143 adjacent to each other and pairs of the sub-banks 14b adjacent to each other define areas in which the organic EL elements 1(R), 1(G), or 1(B) are formed, so each of the areas constitutes a subpixel. A length of each of the subpixels in the Y direction is, for example, 300 μm.

Hereinafter, configurations of each of the components of the organic EL display panel 100 are described.

[Substrate]

The substrate 11 includes a base 111 which is an insulating material, and a thin film transistor (TFT) layer 112. The TFT layer 112 has a drive circuit formed for each of the pixels. The base 111 is, for example, a glass substrate, a silica glass substrate, a silicon substrate, a metal substrate of a metal such as molybdenum sulfide, copper, zinc, aluminum, stainless steel, magnesium, iron, nickel, gold, or silver, a semiconductor substrate such as gallium arsenide, or a plastic substrate. As a plastic material, a thermoplastic resin or a thermosetting resin may be used. For example, the plastic material may be a thermoplastic elastomer such as polyimide (PI), polyetherimide (PEI), polysulfone (PSU), polycarbonate (PC), polyethylene terephthalate (PET), polyethylene naphthalate (PEN), polybutylene terephthalate, a styrene type, a polyolefin type, or a polyurethane type, or a copolymer, a blend, or a polymer alloy mainly containing a material such as epoxy resin, unsaturated polyester, silicone resin, or polyurethane. A laminate layering one kind or two or more kinds of such materials selected so the laminate is durable against processing temperature, may be used.

[Interlayer Insulating Layer]

The interlayer insulating layer 12 is formed on the substrate 11. The interlayer insulating layer 12, formed by using a resin material, serves to planarize the upper surface of the TFT layer 112. As the resin material, for example, a positive type of photosensitive material is used. Examples of such a photosensitive material include an acrylic resin, a polyimide resin, a siloxane resin, a phenol resin, and the like. Although not illustrated in the cross-sectional view in FIG. 1, contact holes are formed in the interlayer insulating layer 12 for each pixel.

[Pixel Electrodes]

The pixel electrodes 13 include metal layers formed by using a light reflective metal material, and are formed on the interlayer insulating layer 12. The pixel electrodes 13 are provided for each of the pixels, and are electrically connected to the TFT layer 112 through the contact holes provided in the interlayer insulating layer 12.

In the present embodiment, the pixel electrodes 13 function as anodes.

Specific examples of the metal materials having light reflectivity include silver (Ag), aluminum (Al), an aluminum alloy, molybdenum (Mo), a silver, palladium, and copper alloy (APC), a silver, rubidium, and gold alloy (ARA), a molybdenum and chromium alloy (MoCr), a molybdenum and tungsten alloy (MoW), a nickel and chromium alloy (NiCr), and the like.

The pixel electrodes 13 may be formed of a metal layer alone, or may be formed of a laminated structure whereby a layer made of a metal oxide such as an indium tin oxide (ITO) or an indium zinc oxide (IZO) is layered on the metal layer.

[Banks]

The banks 141, 142, and 143 are formed on the pixel electrodes 13 exposing areas which are a part of an upper surface of each of the pixel electrodes 13 and covering peripheries of each of the areas exposed. The areas of the upper surfaces of the pixel electrodes 13 not covered with the banks 141, 142, or 143 (hereinafter referred to as "openings") correspond to the subpixels. That is, the banks 141, 142, and 143 have openings 14a provided for each of the subpixels. Hereinafter, the openings of the organic EL element 1(R) are referred to as openings 14aR, the openings of the organic EL element 1(G) as openings 14aG, and the openings of the organic EL element 1(B) as openings 14aB, where distinctions are made between them.

In the present embodiment, the banks 141, 142, and 143 are formed on the interlayer insulating layer 12 where the pixel electrodes 13 are not formed. In other words, where the pixel electrodes 13 are not formed, bottom surfaces of the banks 141, 142, and 143 are in contact with an upper surface of the interlayer insulating layer 12.

The banks 141, 142, and 143 function as structures which suppress applied ink from contacting the ink in the subpixels adjacent to each other when the hole injection layers 15, the hole transport layers 16, and the light emitting layers 17 are formed by an application method. The banks 141, 142, and 143 have liquid repellent portions 146, 147, and 148 which are top portions and upper portions of the sidewalls of the banks adjacent to the top portions, and lyophilic portions which are portions other than the liquid repellent portions at the sidewalls of the banks. The banks 141, 142, and 143 are formed by adding a liquid repellent surfactant such as a fluorine-based compound or a silicone-based compound to a base material which is an insulating resin material. An example of the base material, which is the insulating resin material, may be a positive type of photosensitive material, in particular, an acrylic resin, a polyimide resin, a siloxane resin, a phenol resin, or the like. Note that the base material is not limited to the positive type of photosensitive material, but may be, for example, a negative type of photosensitive material or a non-photosensitive material.

The banks 141 include bank portions facing the openings 14aR and bank portions facing the openings 14aG. Similarly, the banks 142 include bank portions facing the openings 14aG and bank portions facing the openings 14aB. Similarly, the banks 143 include bank portions facing the openings 14aB and bank portions facing the openings 14aR. Each of the bank portions has a truncated quadrangular pyramid shape or a shape similar thereto, and cross sections of the bank portions have a forwardly tapered trapezoidal shape being tapered upward or a convex shape protruding upward. Moreover, each two of the bank portions sandwiching the openings are of same heights and have a same range of heights for the liquid repellent portions.

[Sub-Banks]

Sub-banks 14b are formed on the pixel electrodes 13, exposing areas which are a part of a top surface of each of the pixel electrodes 13 and covering peripheries of each of the parts exposed. The sub-banks 14b extend in a direction orthogonal to a direction in which the banks 141, 142, and 143 extend. Each of the sub-banks 14b is formed over a plurality of the openings 14a, and defines each of the pixel electrodes 13 adjacent to each other in the openings 14a.

In the present embodiment, the sub-banks 14b are formed on the interlayer insulating layer 12 where the pixel electrodes 13 are not formed. In other words, where the pixel electrodes 13 are not formed, bottom surfaces of the sub-banks 14b are in contact with an upper surface of the interlayer insulating layer 12.

The sub-banks 14b serve to control flow of applied ink in a column direction (Y direction) when the hole injection layers 15, the hole transport layers 16, and the light emitting layers 17 are formed by an application method. The sub-banks 14b have a truncated quadrangular pyramid shape or a shape similar thereto, and cross sections have a forwardly tapered trapezoidal shape being tapered upward or a convex shape protruding upward. The heights of the sub-banks 14b from the interlayer insulating layer 12 are lower than the heights of the banks 141, 142, and 143 from the interlayer insulating layer 12. The sub-banks 14b are formed by using a resin material, for example, a positive type of photosensitive material. Examples of the photosensitive material include an acrylic resin, a polyimide resin, a siloxane resin, a phenol resin, and the like. Note that the resin material is not limited to the positive type of photosensitive material, but may be, for example, a negative type of photosensitive material or a non-photosensitive material.

[Hole Injection Layers]

The hole injection layers 15 are formed on the pixel electrodes 13 so as to enhance injection of holes from the pixel electrodes 13 to the light emitting layers 17. A specific example of a material used for forming the hole injection layers 15 may be a conductive polymer material such as a mixture of polythiophene and polystyrene sulfonic acid (PEDOT/PSS).

Note that the hole injection layers 15 may be formed by using an oxide of a transition metal. Specific examples of the transition metals are silver (Ag), molybdenum (Mo), chromium (Cr), vanadium (V), tungsten (W), nickel (Ni), iridium (Ir), and the like. Since transition metals have a plurality of oxidation numbers, a plurality of levels are taken, and thus, hole injection is enhanced, thereby contributing to a reduction in driving voltage. In this case, the hole injection layers 15 preferably have a large work function.

[Hole Transport Layers]

The hole transport layers 16 have a function of transporting holes injected from the hole injection layers 15 to the light emitting layers 17, and are formed by using an organic material of high hole mobility to enable efficient transportation of the holes from the hole injection layers 15 to the light emitting layers 17. The hole transportation layers 16 are formed by coating and drying of a solution containing an organic material. As the organic material for forming the hole transporting layers 16, a polymer compound such as polyfluorene or a derivative thereof, or polyarylamine or a derivative thereof may be used.

Moreover, the hole transporting layers 16 may be formed by using a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound and a styrylamine compound, a butadiene compound, a polystyrene derivative, a triphenylmethane derivative, or a tetraphenylbenzene derivative. In particular, preferably, a porphyrin compound, an aromatic tertiary amine compound, a styrylamine compound, or the like may be used. In this case, the hole transportation layers 16 are formed by a vacuum vapor deposition method. Note that the material and the manufacturing method for the hole transport layers 16 are not limited to the description above, but may be formed by using a predetermined material having a hole transport function, or may be formed by a predetermined manufacturing method usable for manufacturing the hole transportation layers 16.

[Light Emitting Layers]

The light emitting layers 17 are formed in the openings 14a. The light emitting layers 17 have a function whereby R, G, and B colors of light are emitted respectively by recombination of the holes and the electrons. Publicly known materials may be used as materials for the light emitting layers 17.

Examples of organic light emitting materials that may be used in the light emitting layers 17 are fluorescent substances such as an oxinoid compound, a perylene compound, a coumarin compound, an azacoumarin compound, an oxazole compound, an oxadiazole compound, a perinone compound, a pyrrolopyrrole compound, a naphthalene compound, an anthracene compound, a fluorene compound, a fluoranthene compound, a tetracene compound, a pyrene compound, a coronene compound, a quinolone compound and an azaquinolone compound, a pyrazoline derivative and a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, a metal complex of 8-hydroxyquinoline compound, a metal complex of 2-bipyridine compound, a complex of Schiff salt and group III metal, an oxine metal complex, and a rare earth complex. Moreover, a publicly known phosphorescent substance such as a metal complex emitting phosphorescence such as tris (2-phenylpyridine) iridium may be used. The light emitting layers 17 may be formed by using a polymer compound such as polyfluorene or a derivative thereof, polyphenylene or a derivative thereof, or polyarylamine or a derivative thereof, or may be formed by using a mixture of the low molecular weight compound and the polymer compound.

[Electron Transport Layer]

The electron transport layer 18 is formed in common to a plurality of the pixels on the light emitting layers 17 and the banks 141, 142, and 143, and has a function of transporting the electrons injected from the counter electrode 20 to the light emitting layers 17. The electron transport layer 18 is formed by using, for example, an oxadiazole derivative (OXD), a triazole derivative (TAZ), or a phenanthroline derivative (BCP, Bphen).

[Electron Injection Layer]

The electron injection layer 19 is provided on the electron transport layer 18 and in common to a plurality of pixels, and has a function of enhancing injection of the electrons from the counter electrode 20 to the light emitting layers 17.

The electron injection layer 19, for example, is formed by doping a metal material enhancing electron injection property to an organic material having electron transport property. "Doping" in this case refers to substantially even dispersing of metal atoms or metal ions of the metal material into an organic material, in particular, forming of a single phase which contain the organic material and a trace amount of the metal material. Preferably, other phases, in particular, a phase formed only by the metal material such as a metal piece or a metal film, or a phase containing the metal material as a main component do not exist. Further, in the single phase containing the organic material and a trace amount of the metal material, the metal atoms or the metal ions are preferably evenly dispersed, and are preferably not aggregated. The metal material is preferably selected from an alkali metal or an alkaline earth metal, and more preferably from Ba or La. In the present embodiment, Ba is selected. Further, a doping amount of the metal material in the electron injection layer 19 is preferably 5 wt % to 40 wt %. In the present embodiment, the doping amount is 20 wt %. Examples of the organic material having the electron transporting property include a π electron low molecular weight organic material such as an oxadiazole derivative (OXD), a triazole derivative (TAZ), and a phenanthroline derivative (BCP, Bphen).

The electron injection layer 19 may have a metal fluoride layer disposed on a side facing a direction of the light emitting layer 17, the metal of the metal fluoride layer being selected from an alkali metal or an alkaline earth metal.

[Counter Electrode]

The counter electrode 20 is formed in common to a plurality of the pixels and on the electron injection layer 19, and functions as a cathode.

The counter electrode 20 is both light transmissive and electrically conductive, and includes at least a metal layer formed by using a metal material or a metal oxide layer formed by using a metal oxide. A film thickness of the metal layer is about 1 nm to 50 nm so as to secure light transmittance. The material for the metal layer is, for example, Ag, a silver alloy including Ag as a main component, Al, or an Al alloy including Al as a main component. An Ag alloy may be a magnesium-silver alloy (MgAg) or an indium-silver alloy. Ag has basically low electric resistance which is beneficial for the material, and the Ag alloy has excellent heat resistance, corrosion resistance, and maintenance of a fine and a long term electrical conductivity which are beneficial for the material. The Al alloy may be a magnesium-aluminum alloy (MgAl) or a lithium-aluminum alloy (LiAl). Other alloys used as the material for the metal layer may be a lithium-magnesium alloy or a lithium-indium alloy. A material for the metal oxide layer is, for example, indium tin oxide (ITO) or indium zinc oxide (IZO).

The cathode may be configured by the metal layer alone or the metal oxide layer alone, or may be a laminated structure whereby the metal oxide layer is laminated on the metal layer, or a laminated structure whereby the metal layer is laminated on the metal oxide layer.

[Sealing Layer]

The sealing layer 21 is provided on the counter electrode 20. The sealing layer 21 helps to prevent invasion of impurities (water, oxygen) from a side opposite to the substrate 11 into layers such as the counter electrode 20, the electron injection layer 19, the electron transport layer 18, and the light emitting layers 17, and to suppress deterioration of these layers caused by the impurities. The sealing layer 21 is formed by using a light transmitting material such as silicon nitride (SiN) or silicon oxynitride (SiON). Further, in addition to a layer formed by using a material such as silicon nitride (SiN) or silicon oxynitride (SiON), a sealing resin layer formed by using a resin material such as acrylic resin or silicone resin may be provided.

Since the organic EL display panel 100 in the present embodiment is a top emission type, the sealing layer 21 is formed by using a light transmitting material.

[Other]

Though not in FIG. 1, a colored filter or an upper substrate may be sealed on the sealing layer 21 interposing a sealing resin. By sealing the upper substrate, the hole injection layers 15, the hole transportation layers 16, the electron transportation layer 18, the electron injection layer 19, and the counter electrode 20 are protected from moisture, air, and the like.

Effects of Banks According to Embodiments of Present Disclosure

Figure 3A:
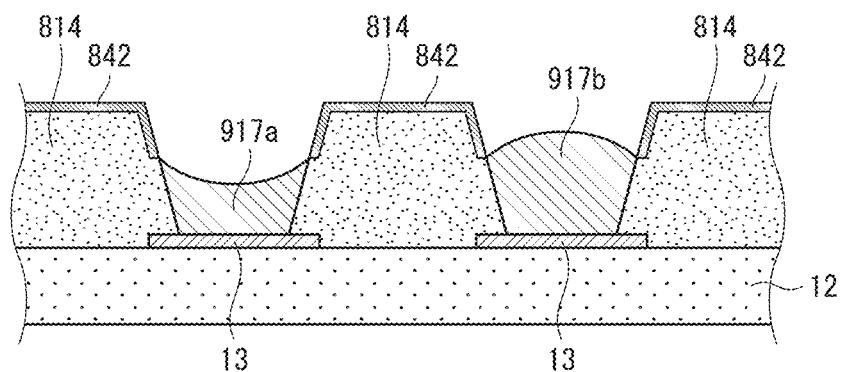
FIGS. 3A, 3B, and 3C are partial cross-sectional views of states illustrating light emitting layers formed in at least one embodiment.
Figure 3B:
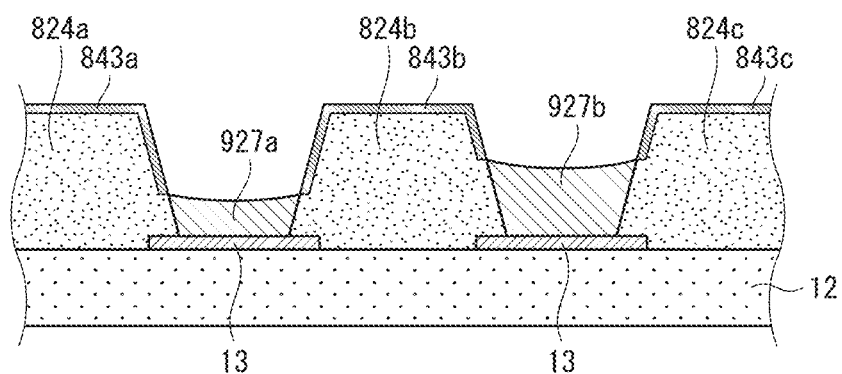
Figure 3C:
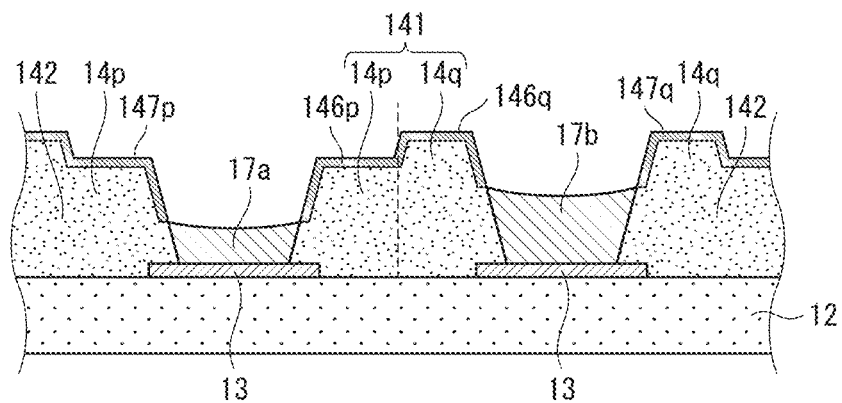

The banks 141, 142 according to at least one embodiment are compared with the banks having other structures, whereby differences are described below with reference to the schematic diagrams. FIGS. 3A, 3B and 3C are schematic cross-sectional diagrams of application processes of the light emitting layers in at least one embodiment and in a comparative example. Horizontal directions correspond to the X direction, and vertical directions correspond to the Z direction in the views.

FIG. 3A is a schematic cross-sectional view in the case where the heights of all the banks 814 are the same and the range of the heights at which the liquid repellent portions 842 are formed are the same. Such configuration of the banks is obtained when all the banks 814 are formed by using a same material and a same process. In this case, pinning positions are the same regardless of the film thickness of the light emitting layers. Therefore, when the pinning positions are high with respect to the film thickness of a light emitting layer 917a, an upper surface becomes concave as in a light emitting layer 917a in FIG. 3A, and the film thickness increases towards the banks. Alternatively, when the pinning positions are low with respect to the film thickness of the light emitting layer 917b, the upper surface becomes convex as in a light emitting layer 917b in FIG. 3B, and the film thickness decreases towards the banks. Since the pinning positions must be matched to the film thickness of the light emitting layers in order to homogenize the film thickness of the light emitting layers, adjusting the film thicknesses according to each of the emitted colors of light is not possible.

FIG. 3B is a schematic cross-sectional view of the banks 824a, 824b, and 824c formed with a same height while a range of heights of liquid repellent portions 843a, 843b, and 843c are controlled according to the film thickness of the light emitting layers formed at each opening. At this time, since the pinning positions are controlled for each of the openings, the film thickness of the light emitting layers can be homogenized for any designed film thickness of the light emitting layers. On the other hand, for example, on the bank 824b, a range of the liquid repellent portion 843b on a sidewall of the bank adjacent to the light emitting layer 927a is different from the range of the liquid repellent portion 843b on a sidewall of the bank adjacent to a light emitting layer 927b. Such structures are difficult to realize by integrally forming the bank 824b and the liquid repellent portion 843b. Further, in order to suppress an overflow of ink from all the openings, the heights of the banks are designed according to the opening that has the greatest amount of ink. Therefore, in the openings with a small amount of ink, the banks become excessively high.

In contrast, as for the banks according to at least one embodiment, as in the banks 141 and 142 in the schematic cross-sectional view of FIG. 3C, the bank portions 14p facing the opening in which the light emitting layer 17a is formed and the bank portions 14q facing the opening in which the light emitting layer 17b is formed have different heights. Accordingly, with respect to the opening in which the light emitting layer 17a is formed, the height of the two bank portions 14p sandwiching the opening and the range of the height of the liquid repellent portions 146p, 147p can be designed according to the light emitting layer 17a. Moreover, with respect to the opening in which the light emitting layer 17b is formed, the height of the two bank portions 14q sandwiching the opening and the range of the height of the liquid repellent portions 146q and 147q are designed according to the light emitting layer 17b. Therefore, with respect to each of the openings, the sidewalls of the banks facing the openings are designed according to the characteristics of the light emitting layers or the functional layers provided in the openings. Moreover, since each two of the bank portions sandwiching the openings have a same height of the bank portions and a same range of the height of the liquid repellent portions, a plurality of the bank portions facing a same type of the light emitting layers or the functional layers are formed in one time, including the liquid repellent portions. Further, the bank portions 14p and 14q are formed by repeating a process of application of materials, patterning, and developing for each height type of the bank portions, thus simplifying the manufacturing process compared with a process whereby the liquid repellent portions are patterned for forming after the lyophilic portions are formed.

As described above, when forming the light emitting layers and/or the functional layers by an application method, the banks according to at least one embodiment are suitable as structures which suppress the ink from over flowing, and are also suitable in generating uniform film thicknesses which improve qualities of the organic EL elements.

2. Method of Manufacturing Organic EL Display Panel 100

[Method of Manufacturing Banks]

Next, a method of manufacturing an organic EL display panel 100 is described with reference to the drawings.

First, a method of manufacturing banks 141, 142, and 143 is described with reference to the drawings. FIG. 4A to 7 are schematic cross-sectional views of each step in manufacturing the banks 141, 142, and 143 according to at least one embodiment. FIG. 8 is a flowchart of the manufacturing process of the banks 141, 142, and 143 according to at least one embodiment.

In the present embodiment, film thickness of the light emitting layers increases in order of red light emitting layers, green light emitting layers, and blue light emitting layers.

(1) Forming First Bank Material Layer 140R

In FIGS. 9A, 9B, 9C, and 9D, the interlayer insulating layer 12 and the pixel electrodes 13 are formed on the substrate 11 (details will be described later).

Figure 4A:
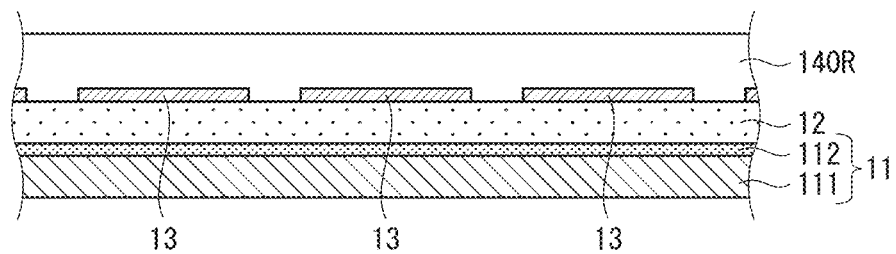
FIGS. 4A, 4B, and 4C are schematic partial cross-sectional views of a part of a process of manufacturing banks 141, 142, and 143 according to at least one embodiment.

Next, in FIG. 4A, a first bank material layer 140R is formed so as to cover the interlayer insulating layer 12 and the pixel electrodes 13 (step S210). For the first bank material layer 140R, for example, a fluorine compound which is a surfactant having liquid repellency is added to an acrylic resin, a polyimide resin, a siloxane resin, or a phenol resin which is a negative type of photosensitive material. In particular, for example, the first bank material layer NOR is formed by using a solution obtained by dissolving a phenolic resin as a bank resin and a fluorine compound in a solvent (for example, a mixed solvent of propyleneglycol monomethyl ether acetate (PGMEA) and ethyl lactate and Gamma-Butyrolactone (GBL), which is applied on the pixel electrodes 13 and the interlayer insulating layer 12 by a spin coating method or the like.

(2) Shaping First Bank Material Layer 140R

Figure 4B:
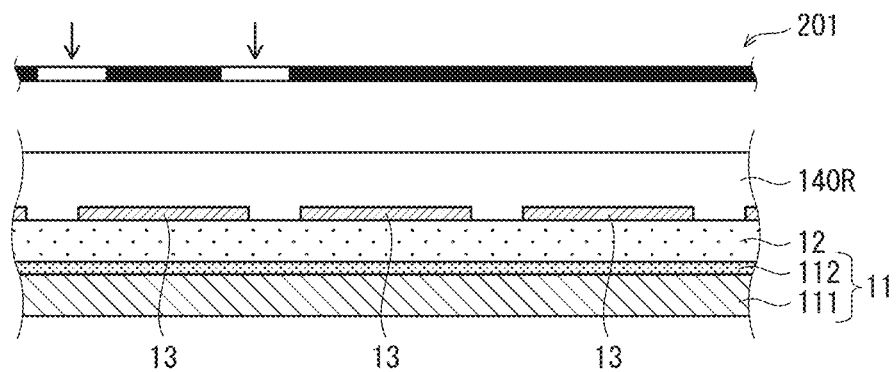
Figure 4C:
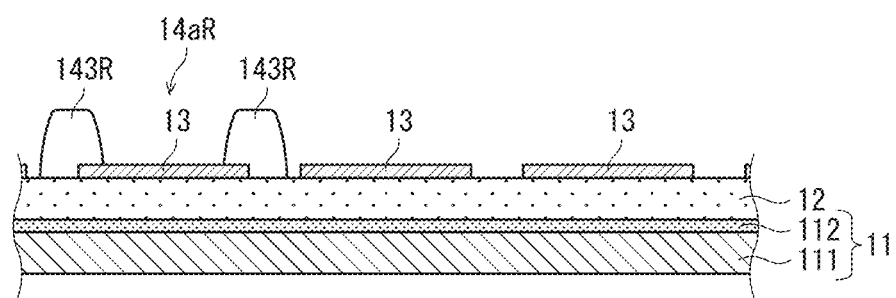

Next, in FIG. 4B, pattern exposure is performed on the first bank material layer 140R using a photomask 201 (step S220). Then, in FIG. 4C, bank portions 143R facing openings 14aR are shaped by removing uncured portions of the first bank material layer 140R through development (step S230).

(3) Forming Second Bank Material Layer 140G

Figure 5A:
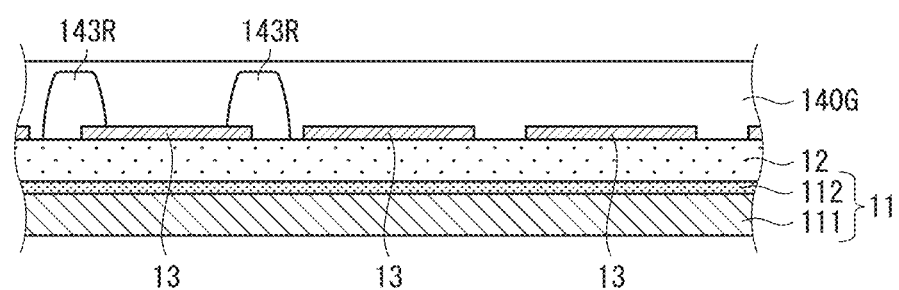
FIGS. 5A, 5B, and 5C are schematic partial cross-sectional views of a part of a process of manufacturing banks 141, 142, and 143 according to at least one embodiment.

Next, in FIG. 5A, a second bank material layer 140G is formed so as to cover the interlayer insulating layer 12 and the pixel electrodes 13 (step S240). As a material for the second bank material layer 140G, for example, a material similar to the material for the first bank material layer 140R is used.

(4) Shaping Second Bank Material Layer 140G

Figure 5B:
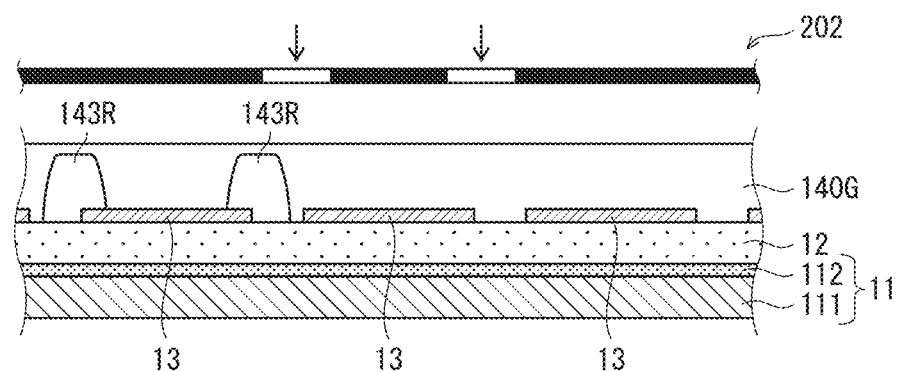
Figure 5C:
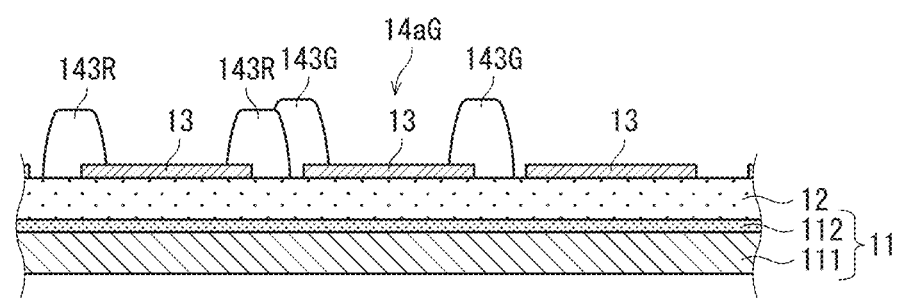

Next, in FIG. 5B, pattern exposure is performed on the second bank material layer 140G using a photomask 202 (step S250). Then, in FIG. 5C, bank portions 143G facing openings 14aG are shaped by removing uncured portions of the second bank material layer 140G through development (step S260).

(5) Forming Third Bank Material Layer 140B

Figure 6A:
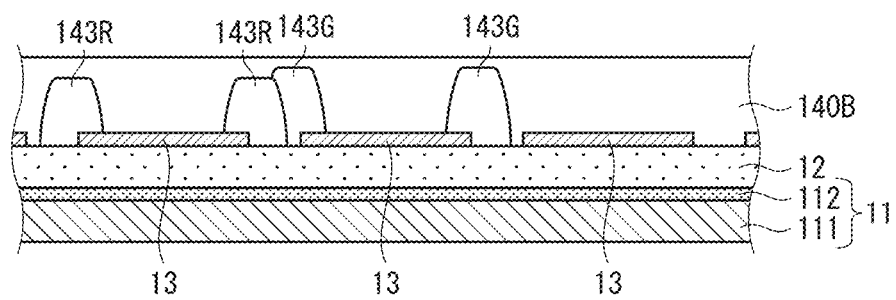
FIGS. 6A, 6B, and 6C are schematic partial cross-sectional views of a part of a process of manufacturing banks 141, 142, and 143 according to at least one embodiment.

Next, in FIG. 6A, a third bank material layer 140B is formed so as to cover the interlayer insulating layer 12 and the pixel electrodes 13 (step S270). As a material for the third bank material layer 140B, for example, a material similar to the material for the first bank material layer 140R is used.

(6) Shaping Third Bank Material Layer 140B

Figure 6B:
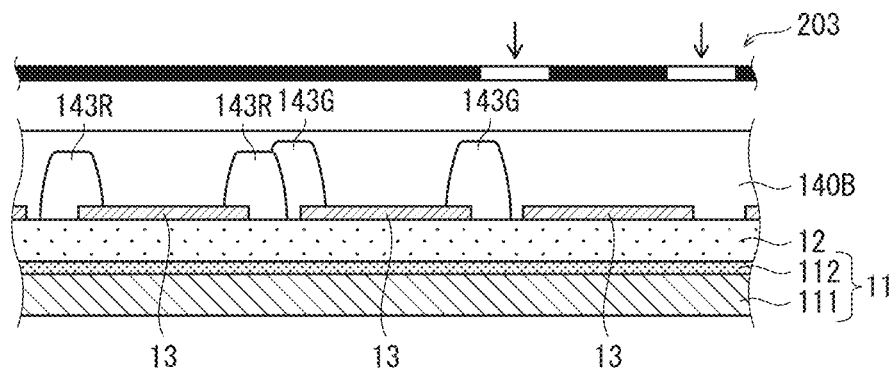
Figure 6C:
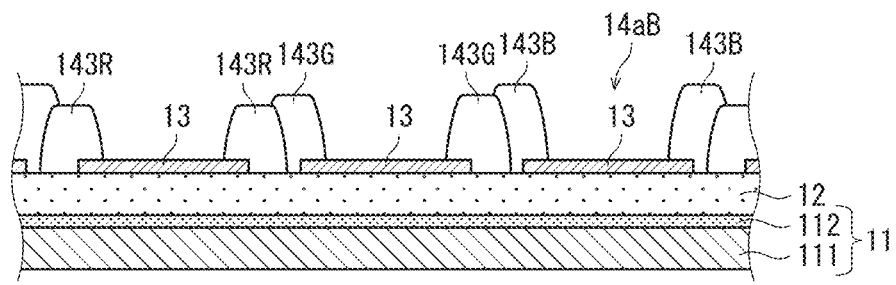

Next, in FIG. 6B, pattern exposure is performed on the third bank material layer 140B using a photomask 203 (step S280). Then, in FIG. 6C, by removing uncured portions of the third bank material layer 140B through development (step S290), bank portions 143B facing openings 14aB are shaped (7) Baking Bank Layers Finally, the banks 141, 142, and 143 are completed by baking (step S295). Baking, for example, is performed at a temperature from 150° C. to 250° C. for 60 minutes.

Here, baking is performed on the first bank material layer 140R, the second bank material layer 140G, and the third bank material layer 140B collectively after shaping. However, baking may be performed each time shaping is performed, that is, after (2) and before (3), after (4) and before (5), and after (6). Though the number of baking processes is increased, for example, effects on unbaked portions of the first bank portion 143R from the development process on shaping the second bank portion 143G are suppressed.

Figure 7:
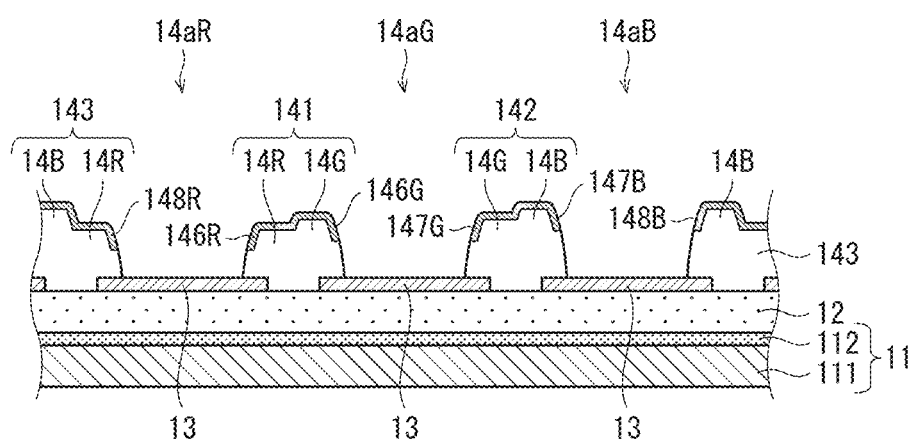
FIG. 7 is a schematic partial cross-sectional view of a part of a process of manufacturing banks 141, 142, and 143 according to at least one embodiment.
Figure 8:
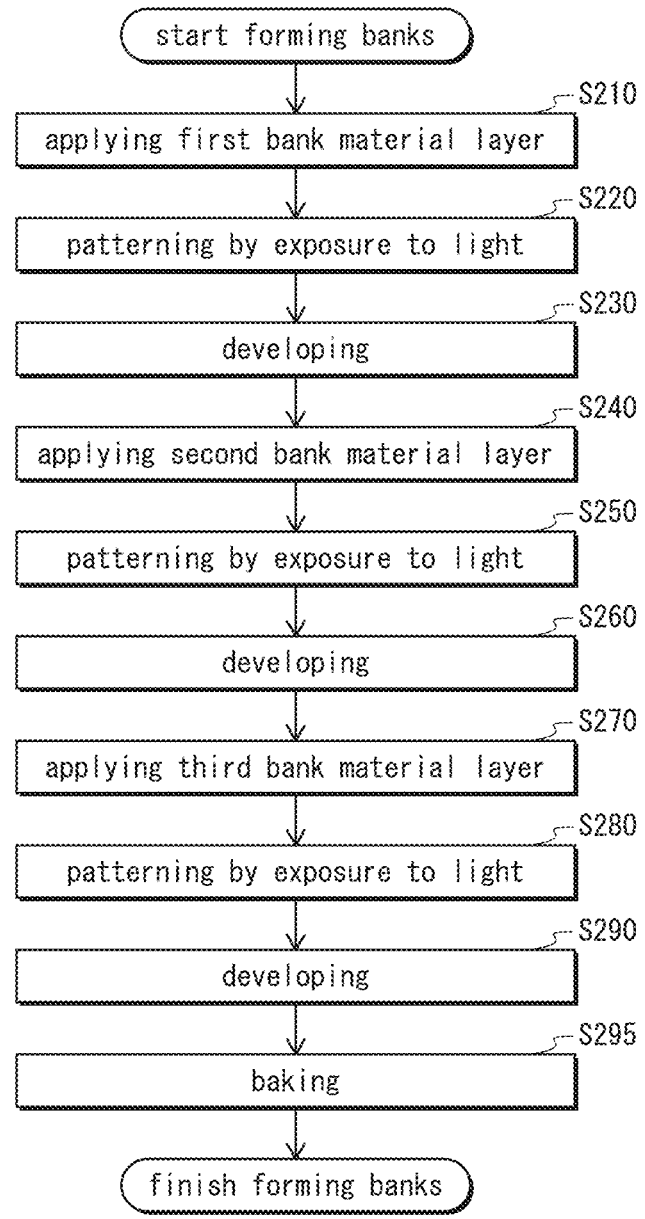
FIG. 8 is a flowchart of a process of manufacturing banks 141, 142, and 143 according to at least one embodiment.

The banks 141, 142, and 143 are completed by the above steps as in FIG. 7. At this time, the liquid repellent portions 146 of the banks 141 include the liquid repellent portions 146R facing the openings 14aR and the liquid repellent portions 146G facing the openings 14aG. Likewise, the liquid repellent portions 147 of the banks 142 include the liquid repellent portions 147G facing the openings 14aG and the liquid repellent portions 147B facing the openings 14aB. Likewise, the liquid repellent portions 148 of the banks 143 include the liquid repellent portions 148B facing the openings 14aB and the liquid repellent portions 148R facing the openings 14aR. Further, when observing the liquid repellent portions facing the openings 14aR, the liquid repellent portions 148R and the liquid repellent portions 146R are each formed as a part of the bank portions 143R, and thus have a same range of height. Likewise, the liquid repellent portions 146G and the liquid repellent portions 147G facing the openings 14aG are each formed as a part of the bank portions 143G, and thus have a same range of height. Likewise, the liquid repellent portions 147B and the liquid repellent portions 148B facing the openings 14aB are each formed as a part of the bank portions 143B, and thus have a same range of height.

In the above description, the bank portions 143R, 143G, and 143B are formed in this order, but the order of forming the bank portions is not limited thereto.

As described above, the organic EL display panel 100 according to the present embodiment is characterized in that the heights of the bank portions facing the openings vary for each of the openings, and the sidewalls of the banks have the liquid repellent portions extending to the top portions. Due to such characteristic feature, heights of the bank portions and the pinning positions defined by a range of heights of the liquid repellent portions are designed according to each of the openings, and thus the functional layers and light emitting layers are formed with uniform film thicknesses.

[Method of Manufacturing Organic EL Display Panel]

Next, a method of manufacturing an organic EL display panel 100 is described with reference to the drawings. FIGS. 9A, 9B, 9C, 9D, 9E, 10A, 10B, 10C, 11A, 11B, 11C, and 11D are schematic cross-sectional views of states illustrating each of the steps in manufacturing the organic EL display panel 100 according to at least one embodiment. FIG. 12 is a flowchart of a method of manufacturing the organic EL display panel 100 according to at least one embodiment.

(1) Forming Substrate 11

Figure 9A:
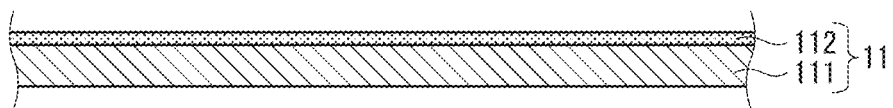
FIG. 9A to 9E are schematic partial cross-sectional views of a part of a process of manufacturing organic EL display panel 100 according to at least one embodiment.

First, in FIG. 9A, a TFT layer 112 is layered on a base 111 so as to form the substrate 11 (step S1). The TFT layer 112 may be formed by using a publicly known TFT manufacturing method.

Figure 9B:
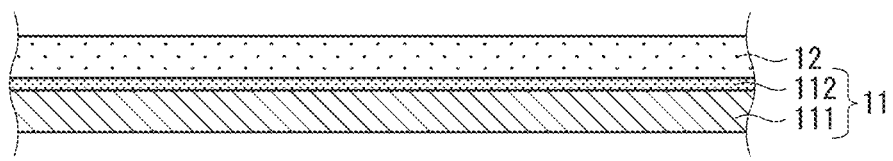

Next, in FIG. 9B, an interlayer insulating layer 12 is formed on the substrate 11 (step S2). The interlayer insulating layer 12, for example, is formed by laminating, using a method such as a plasma chemical vapor deposition (CVD) method or a sputtering method.

Next, dry etching is performed on the interlayer insulating layer 12 on parts above source electrodes of the TFT layer to provide contact holes. The contact holes are formed so as to have bottom portions expose surfaces of the source electrodes.

Next, contact electrode layers are formed along interior walls of the contact holes. A part of an upper portion of each of the contact electrode layers is disposed on the interlayer insulating layer 12. The contact electrode layers are formed by using, for example, a sputtering method to dispose a metal film, and then a photolithography method and a wet etching method are used for patterning.

(2) Forming Pixel Electrode Layers 13

Figure 9C:
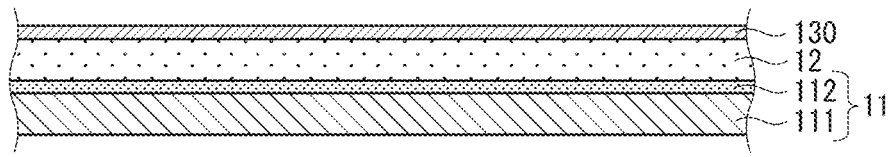

Next, in FIG. 9C, a pixel electrode material layer 130 is formed on the interlayer insulating layer 12 (step S3). The pixel electrode material layer 130, for example, is formed by using a vacuum vapor deposition method, a sputtering method, and the like.

Figure 9D:
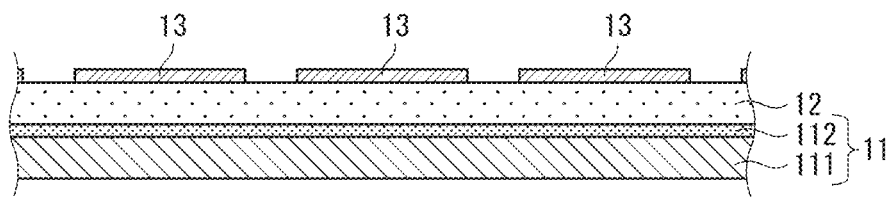

Then, in FIG. 9D, the pixel electrode material layer 130 is patterned by etching to form the pixel electrodes 13 defined for each subpixel (step S4).

(3) Forming Sub-Banks 14b

Next, on the pixel electrodes 13 and the interlayer insulating layer 12, a sub-bank material layer is formed by applying a resin for the sub-banks which is a material for the sub-banks 14b (step S5). As the resin for the sub-banks, for example, a phenol resin which is a positive type of photosensitive material is used. The sub-bank material layer is formed by uniformly applying a solution which is made by dissolving a phenol resin in a solvent on the pixel electrodes 13 and the interlayer insulating layer 12, using a spin coating method or the like. Then, pattern exposure and developing are performed on the sub-bank material layer to form sub-banks 14b.

(4) Forming Banks 141, 142, and 143

Figure 9E:
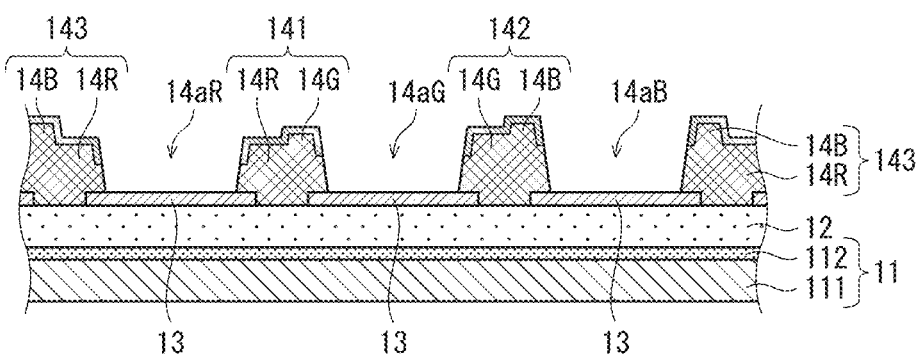

Next, in FIG. 9E, the banks 141, 142, and 143 are formed on the pixel electrodes 13 and the interlayer insulating layer 12 (step S6). Explanations will be omitted here as details have already been described referring to steps S210 to S295 in FIG. 8. This defines the openings 14a, which are areas in which the light emitting layers 17 are formed.

Here, baking is performed on the sub-banks 14b during the baking step (step S6, and in detail, step S295 in FIG. 8) of the banks 141, 142, and 143. Alternatively, the sub-banks 14b may be baked before the start of (4) after the end of (3). Number of processes is increased when baking is performed after each shaping, but the banks 141, 142, and 143 and the sub-banks 14b which are already shaped and unbaked may be less affected by the development process and the like.

(5) Forming Hole Injection Layers

Figure 10A:
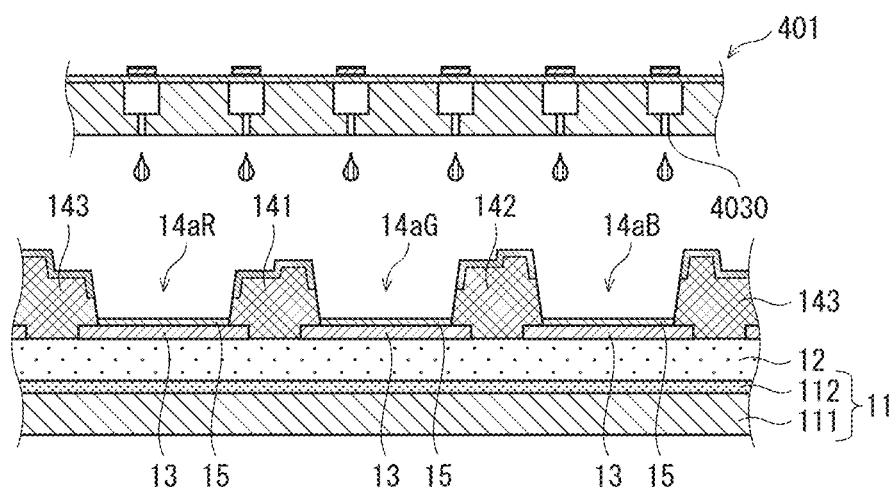
FIGS. 10A, 10B, and 10C are schematic partial cross-sectional views of a part of a process of manufacturing organic EL display panel 100 according to at least one embodiment.

Next, as in FIG. 10A, with respect to the openings 14a defined by the banks 141, 142, and 143 and the sub-banks 14b, the hole injection layers 15 are formed by discharging ink containing the constituent material of the hole injection layers 15 from nozzles 4030 of an inkjet head 401 onto the pixel electrodes 13 in the openings 14a, and then by baking (drying) (step S7).

(6) Forming Hole Transport Layers

Figure 10B:
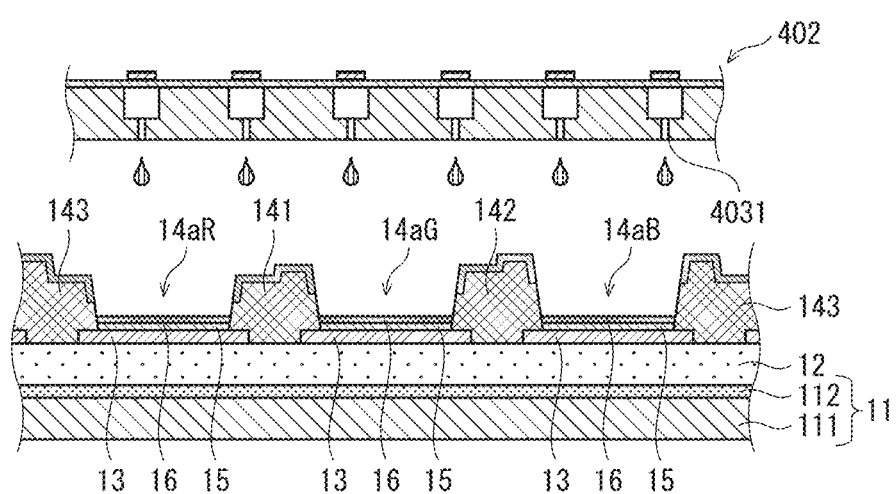

Next, as in FIG. 10B, the hole transport layers 16 are formed by discharging ink containing a constituent material of the hole transport layers 16 from the nozzles 4031 of the ink jet head 402 onto the hole injection layers 15 in the openings 14a, and then by baking (drying) (step S8).

(7) Forming Light Emitting Layers

Figure 10C:
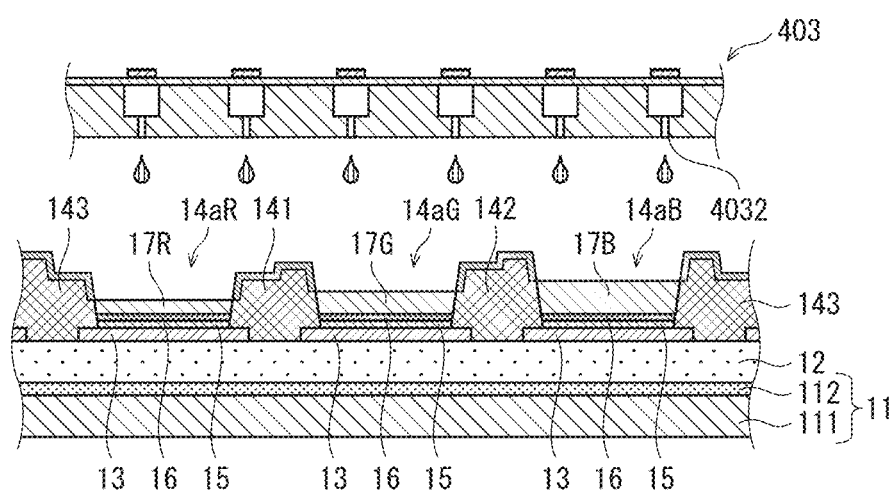

Next, as in FIG. 10C, the light emitting layers 17 are formed by discharging ink containing a constituent material of the light emitting layers 17 from the nozzles 4032 of the ink jet head 403 onto the hole transport layers 16 in the openings 14a, then by baking (drying) (step S9).

(8) Forming Electron Transport Layers

Figure 11A:
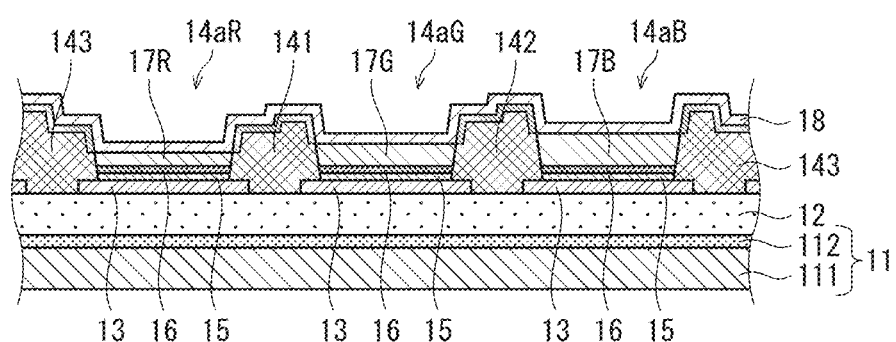
FIG. 11A to 11D are schematic partial cross-sectional views of a part of a process of manufacturing organic EL display panel 100 according to at least one embodiment.
Figure 12:
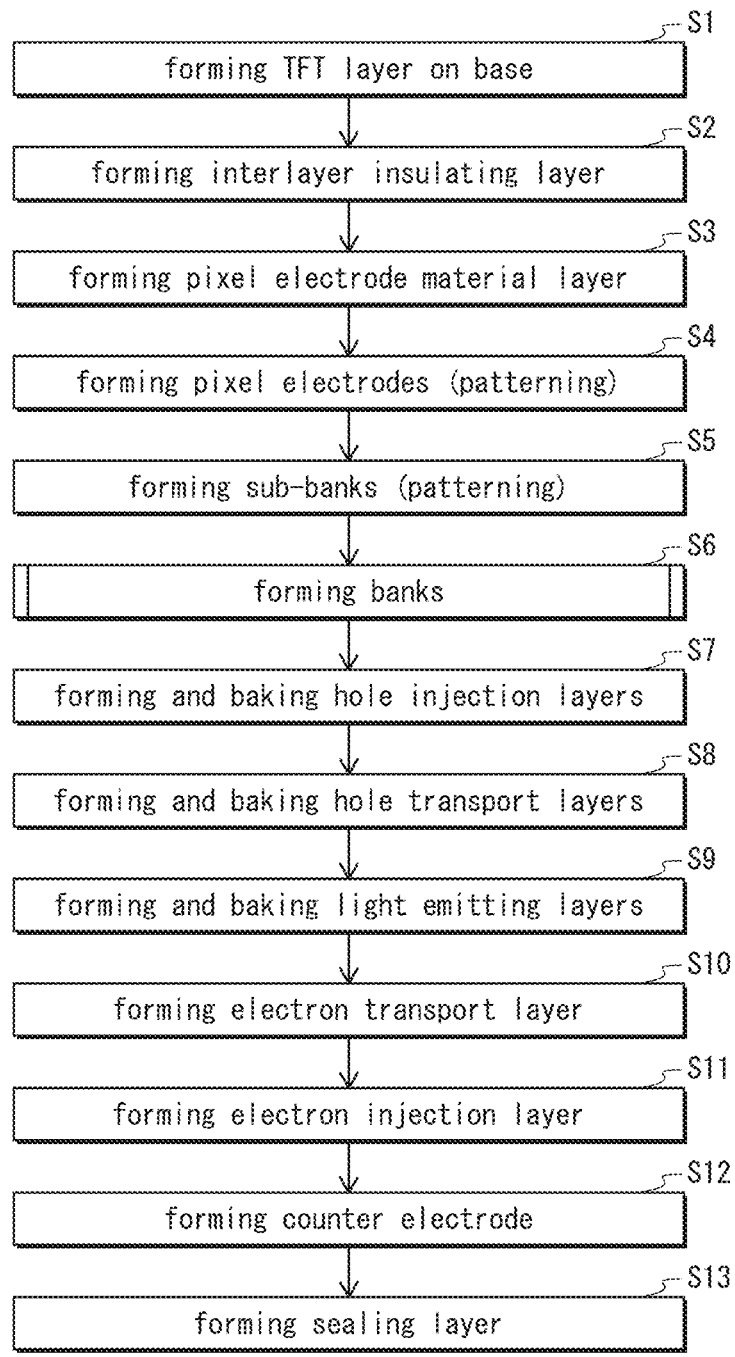
FIG. 12 is a flowchart of a process of manufacturing organic EL display panel 100 according to at least one embodiment.

Next, as in FIG. 11A, on the light emitting layers 17 and on the banks 141, 142, and 143, the electron transport layers 18 are formed common to the subpixels by depositing a material constituting electron transport layers 18 using a vacuum vapor deposition method or a sputtering method (step S10).

(9) Forming Electron Injection Layer

Figure 11B:
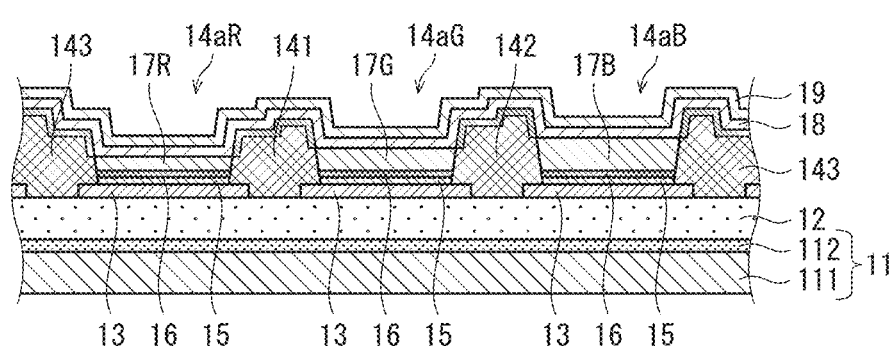

Next, as in FIG. 11B, on the electron transport layer 18, the electron injection layer 19 is formed common to the subpixels by depositing a material constituting an electron injection layer 19 using a vacuum vapor deposition method, or sputtering (step S11).

(10) Forming Counter Electrode

Figure 11C:
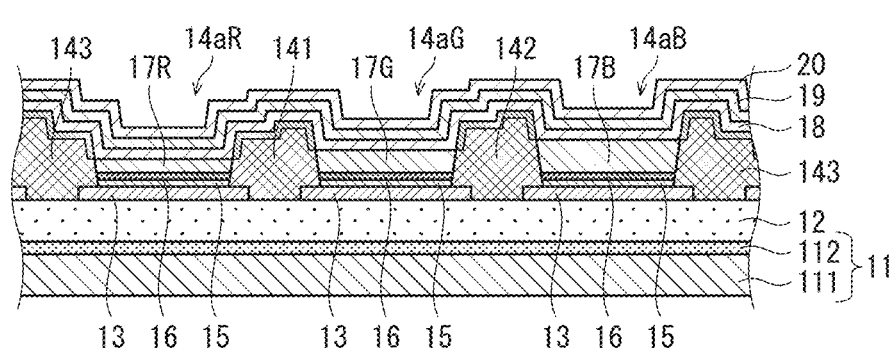

Next, as in FIG. 11C, on the electron injection layer 19, the counter electrode 20 is formed common to the subpixels by depositing a material constituting a counter electrode 20 using a vacuum vapor deposition method or a sputtering method (step S12).

(11) Forming Sealing Layer

Figure 11D:
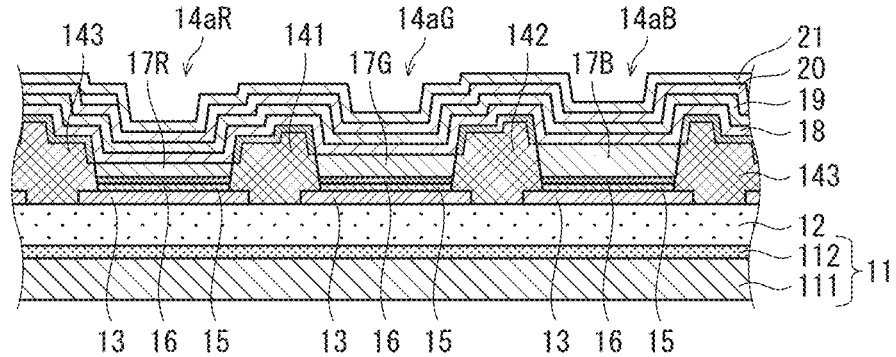

Finally, as in FIG. 11D, on the counter electrode 20, the sealing layer 21 is formed common to the subpixels by depositing a material for forming a sealing layer using a CVD method or a sputtering method (step S13).

Thus, manufacturing of the organic EL display panel 100 is completed through the above steps.

Note that a color filter or an upper substrate may be disposed on and bonded to the sealing layer 21.

3. Overall Configuration of Organic EL Display Device

FIG. 14 is a schematic block diagram of a configuration of an organic EL display device 1000 including an organic EL display panel 100. In FIG. 14, the organic EL display device 1000 has a structure which includes the organic EL display panel 100 and a driving control unit 200 connected to the organic EL display panel 100. The driving control unit 200 corresponds to four drive circuits 210-240 and a control circuit 250.

The arrangement of the driving control unit 200 in relation to the organic EL display panel 100 is not limited to the arrangement above in an actual organic EL display device 1000.

Figure 13A:
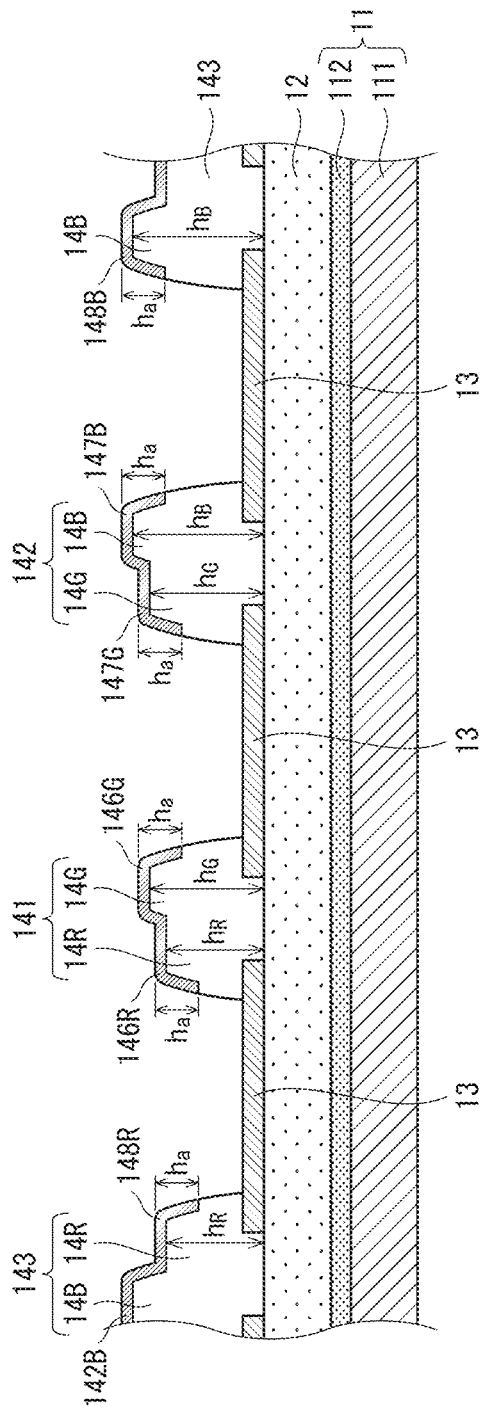
FIGS. 13A and 13B are schematic partial cross-sectional views of configurations of banks 141, 142, and 143 according to at least one embodiment.

4. Modifications (1) According to at least one embodiment above, all the banks are formed using a similar material. However, the following embodiment may be used as an alternative. For example, with respect to materials for each of the bank portions, an amount of a surfactant added in the material for the bank portions can be changed so that a content ratio of the surfactant decreases as volumes of the bank portions increase. This alters heights of the bank portions to $h_R$, $h_G$, or $h_B$ while maintaining a range of height of the liquid repellent portions to $h_a$ for any of the bank portions as in a schematic cross-sectional view in FIG. 13A.

Figure 13B:
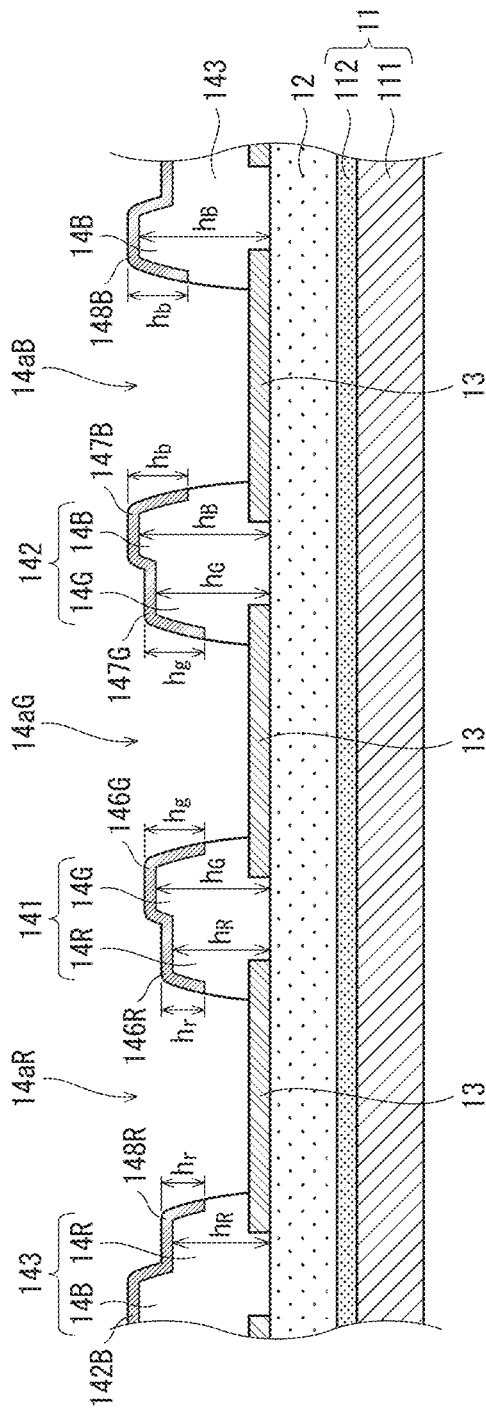

Further, for example, the bank portions and the liquid repellent portions of each of the bank portions can be designed to have predetermined heights by changing content ratios of materials and additives according to the bank portions. For example, as in a schematic cross-sectional view in FIG. 13B, the height $h_R$ of the bank portions facing the openings 14aR and a height range $h_r$ of the heights of the liquid repellent portions, the height $h_G$ of the bank portions facing the openings 14aG and a height range $h_g$ of the liquid repellent portions, the height $h_B$ of the bank portions facing the openings 14aB and a height range $h_b$ of the liquid repellent portions may be designed independent from each other.

(2) According to at least one embodiment above, the organic EL display panel is described as having three types of the light emitting layers emitting light of R, G, and B colors respectively, but the light emitting layers may be of two types, or of four types or more. Here, the types of the light emitting layers refer to variations in film thicknesses of the light emitting layers or the functional layers, and in a case where the film thicknesses of the light emitting layers or the functional layers are different within a same one of the emitted colors, such light emitting layers are considered as being a different type. Moreover, arrangements of the light emitting layers are not limited to RGBRGB . . . , but may be RGBBGRRGB . . . or an arrangement having an auxiliary electrode layer or another non-light emitting area between the pixels. At this time, with respect to the banks that have a same type of the light emitting layers on both sides, the banks may have a conventional structure whereby the bank portions at either side facing either one of the openings have a same structure. Further, with respect to the banks provided with the light emitting layer on only one side, the banks may be of a conventional configuration, or may only have the bank portions for a side which the openings are provided for the light emitting layers, and have no structure for a side without the light emitting layer.

(3) According to at least one embodiment above, in the organic EL element 1, the hole injection layers 15, the hole transport layers 16, and the light emitting layers 17 are all formed by an application method, but as long as one of those layers is formed by an application method, other layers may be formed by other methods such as a vapor deposition method or a sputtering method.

Moreover, the hole injection layers 15, the hole transport layers 16, the electron transport layer 18, and the electron injection layer 19 do not necessarily have the structure according to at least one embodiment above. One or more of the hole injection layers 15, the hole transport layers 16, the electron transport layer 18, and the electron injection layer 19 layers may be omitted, or other functional layer may be added. Further, for example, an electron injection transport layer may be provided in place of the electron transport layer 18 and the electron injection layer 19.

(4) According at least one embodiment above, the organic EL display panel is described as a top emission type, whereby the pixel electrodes have a light reflecting property, and the counter electrode has a light transmitting property. However, the organic EL display panel according to the present disclosure may be a so-called bottom emission type.

(5) The organic EL display panel and the organic EL display device according to the present disclosure have been described based on the embodiments and the modified examples, but the present invention is not limited to the above described embodiments and modifications. The present disclosure includes at least one embodiment realized by combining any of the above-described embodiments with various modifications that can be conceived by those skilled in the art, or by arbitrarily combining the components and functions in the above-described embodiments and modifications without departing from the spirit of the present disclosure.

The organic EL display panel and the method of manufacturing the organic EL display panel according to the present disclosure are useful in manufacturing the organic EL display panel in which at least one of the light emitting layers and the functional layers is formed by a coating method, whereby the film thicknesses of the light emitting layers and the functional layers are homogenized so as to manufacture the organic EL display panel having excellent light emitting characteristics.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included thein.

What is claimed is:

1. An organic EL display panel comprising:
   a substrate;
   pixel electrodes arranged in a matrix above the substrate;
   banks arranged above the substrate, extending in a column direction between the pixel electrodes adjacent to each other in a row direction;
   a first light emitting layer disposed in a first gap selected from gaps between the banks adjacent to each other in the row direction above the pixel electrodes;
   a second light emitting layer disposed in a second gap adjacent to the first gap in the row direction above the pixel electrodes; and
   a counter electrode disposed above the first light emitting layer and above the second light emitting layer, wherein
   a film thickness of the first light emitting layer is thicker than a film thickness of the second light emitting layer;
   a bank between the first gap and the second gap has a first bank portion facing the first gap and a second bank portion facing the second gap, a height of the first bank portion being higher than a height of the second bank portion; and
   a first pinning position where a sidewall of the first bank portion contacts with the first light emitting layer is higher than a second pinning position where the sidewall of the second bank portion contacts with the second light emitting layer.

2. The organic EL display panel of claim 1, wherein
   a height of the first pinning position depends on the height of the first bank portion, and
   a height of the second pinning position depends on the height of the second bank portion.

3. The organic EL display panel of claim 2, wherein
   the height of the first pinning position is a value obtained by multiplying the height of the first bank portion by a first coefficient, and
   the height of the second pinning position is a value obtained by multiplying the height of the second bank portion by a second coefficient.

4. The organic EL display panel of claim 3, wherein
   the first coefficient is different from the second coefficient.

5. The organic EL display panel of claim 2, wherein
   the height of the first pinning position is lower than the height of the first bank portion by a predefined value, and
   the height of the second pinning position is lower than the height of the second bank portion by the predefined value.

6. The organic EL display panel of claim 1, wherein
   the first bank portion and the second bank portion are each formed from an electrically insulating resin material and each includes a surfactant having liquid repellency.

7. The organic EL display panel of claim 6, wherein
   the surfactant is a fluorine-based compound or a silicone-based compound.

8. The organic EL display panel of claim 6, wherein
   the surfactant of the sidewall of the first bank portion is present in higher ratio above the first pinning position than below the first pinning position in the sidewall of the first bank portion facing the first light emitting layer, and
   the surfactant of the sidewall of the second bank portion is present in higher ratio above the second pinning position than below the second pinning position in the sidewall of the second bank portion facing the second light emitting layer.

9. An organic EL display device provided with an organic EL display panel,
   the organic EL display panel comprising:
   a substrate;
   pixel electrodes arranged in a matrix above the substrate;
   banks arranged above the substrate, extending in a column direction between the pixel electrodes adjacent to each other in a row direction;
   a first light emitting layer disposed in a first gap selected from gaps between the banks adjacent to each other in the row direction above the pixel electrodes;
   a second light emitting layer disposed in a second gap adjacent to the first gap in the row direction above the pixel electrodes; and
   a counter electrode disposed above the first light emitting layer and above the second light emitting layer, wherein
   a film thickness of the first light emitting layer is thicker than a film thickness of the second light emitting layer;
   a bank between the first gap and the second gap has a first bank portion facing the first gap and a second bank portion facing the second gap, a height of the first bank portion being higher than a height of the second bank portion; and
   a first pinning position where a sidewall of the first bank portion contacts with the first light emitting layer is higher than a second pinning position where the sidewall of the second bank portion contacts with the second light emitting layer.

10. A method of manufacturing an organic EL display panel comprising:
    preparing a substrate;
    forming pixel electrodes above the substrate in a matrix;
    forming banks above the substrate extending in a column direction between the pixel electrodes adjacent to each other in a row direction;
    forming a first light emitting layer in a first gap selected from gaps between the banks adjacent to each other in the row direction by applying ink including a first light emitting material;
    forming a second light emitting layer in a second gap adjacent to the first gap in the row direction by applying ink including a second light emitting material, the second light emitting layer having a film thickness less than the film thickness of the first light emitting layer; and
    forming a counter electrode above the first light emitting layer and the second light emitting layer, wherein
    in the forming of the banks,
       a height of a first bank portion facing the first gap is made higher than a height of a second bank portion facing the second gap, and
       liquid repellent portions are made to extend from top portions of the banks to a sidewall of the first bank portion facing the first gap and a sidewall of the second bank portion facing the second gap.

11. The method of manufacturing the organic EL display panel of claim 10, wherein
    the forming of the banks comprises using a resin material including a surfactant having liquid repellency as a material for the banks, the liquid repellent portions being portions of the banks containing a predefined ratio or more of the surfactant.

12. The method manufacturing the organic EL display panel of claim 11, wherein
    a fluorine-based compound or a silicone-based compound is used as the surfactant.

13. The method of manufacturing the organic EL display panel of claim 10, wherein
the forming of the banks comprises forming the second bank portion after forming the first bank portion.

* * * * *